United States Patent [19]

Kakumu

[11] Patent Number: 5,756,365

[45] Date of Patent: May 26, 1998

[54] METHOD OF MANUFACTURING MOS-TYPE SEMICONDUCTOR DEVICE HAVING ELECTRODE STRUCTURE CAPABLE OF COPING WITH SHORT-CHANNEL EFFECTS

[75] Inventor: Masakazu Kakumu, Kawasaki, Japan

[73] Assignee: Kabushiki Kaisha Toshiba, Tokyo, Japan

[21] Appl. No.: 719,334

[22] Filed: Sep. 25, 1996

Related U.S. Application Data

[60] Continuation of Ser. No. 514,826, Aug. 14, 1995, abandoned, which is a division of Ser. No. 146,717, Nov. 1, 1993, Pat. No. 5,466,958.

[30] Foreign Application Priority Data

Oct. 30, 1992 [JP] Japan ................... 4-292774

[51] Int. Cl.$^6$ ................ H01L 21/8234; H01L 21/8238
[52] U.S. Cl. .................... 437/40 SW; 437/41 SW; 437/44; 437/233; 437/34; 437/57
[58] Field of Search ............... 437/40 R, 41 R, 437/233, 29, 56, 57, 58, 59, 34, 40 SW, 41 SW

[56] References Cited

U.S. PATENT DOCUMENTS 5,061,647 10/1991 Roth et al. ................ 437/413
5,087,582 2/1992 Campell et al. ............ 437/40 SW
5,202,276 4/1993 Malhi ....................... 437/44
5,279,979 1/1994 Shino et al. ............... 437/40 SW

FOREIGN PATENT DOCUMENTS

| 56-12773 | 2/1981 | Japan . | |
| 1232765 | 9/1989 | Japan . | |
| 020135 | 1/1990 | Japan | 437/44 |
| 234936 | 2/1990 | Japan . | |

*Primary Examiner*—Michael Trinh
*Attorney, Agent, or Firm*—Loeb & Loeb LLP

[57] ABSTRACT

In a semiconductor device, an $n^+$-type polysilicon layer is formed on a substrate through a gate oxide layer. A $p^+$-type source or drain diffusion layer is formed on both sides of an impurity layer in the substrate. The $n^+$-type polysilicon layer is positioned over an intermediate portion of a channel formation layer, and has an oxide layer on an upper surface thereof. The $n^+$-type polysilicon layer has at its side portions a $p^+$-type polysilicon layer to make a gate electrode together with the $n^+$-type polysilicon layer. The gate electrode semiconductor layer is formed on the channel formation layer through the gate insulation layer in such a manner that in a portion contacting with the gate insulation layer, the nearer the portion approaches the impurity layers of the source and drain regions, the larger the work function of the portion becomes.

5 Claims, 9 Drawing Sheets

METHOD OF MANUFACTURING MOS-TYPE SEMICONDUCTOR DEVICE HAVING ELECTRODE STRUCTURE CAPABLE OF COPING WITH SHORT-CHANNEL EFFECTS

This is a continuation of application Ser. No. 08/514,826, filed Aug. 14, 1995, now abandoned, which is a division of application Ser. No. 08/146,717, filed Nov. 1, 1993, now U.S. Pat. No. 5,466,958.

BACKGROUND OF THE INVENTION

The present invention relates to semiconductor devices and a manufacturing method thereof, and more particularly to metal oxide semiconductor (MOS) type devices having an electrode structure capable of coping with short-channel effects and a manufacturing method thereof.

FIG. 1 shows a constitution of a conventional semiconductor device such as a complementary-MOS (CMOS) device, specifically as a CMOS inverter.

In FIG. 1, numeral 101 denotes an n-type silicon, Si(100), substrate, and a p-type well 102 is formed in the substrate 101. An element-dividing oxide layer 103 is formed upon the substrate 101 for forming on the substrate 101 and well 102 respective element regions for a PMOS and an NMOS and a dividing region for insulating between elements. A gate oxide layer 104 having a thickness of 100 angstroms is formed on the element regions.

A polysilicon layer 105 having a thickness of 3000 angstroms to be a gate electrode is formed on the element region for the PMOS via the gate oxide layer 104, which is made as an n$^+$-type by a diffusion of phosphorus (P). A first impurity layer 106 is formed in a region immediately under the polysilicon layer 105 in the substrate 101 to prevent punch-through, and a second impurity layer 107 is formed on the first impurity layer 106 at the upper surface of the substrate 101 to adjust a threshold voltage value $V_{th}$. First and second impurity diffusion layers 108 and 109 to be a source or a drain of a PMOS-FET (field effect transistor) are formed at both sides of the first and second impurity layers 106 and 107 by ion implantation or a diffusion of boron (B) or boron fluoride (BF$_2$).

On the other hand, a polysilicon (polycrystalline silicon) layer 110 having a thickness of 3,000 angstroms to be a gate electrode is formed on the element region for the NMOS via the gate oxide layer 104, with the polysilicon layer 110 also an n$^+$-type formed by a P diffusion. A third impurity layer 111 is formed in a region immediately under the polysilicon layer 110 in the well 102 to prevent punch-through, and a fourth impurity layer 112 is formed on the third impurity layer 111 at the upper surface of the well 102 to adjust a threshold voltage value $V_{th}$. Third and fourth impurity diffusion layers 113 and 114 to be a source or drain are formed at both sides of the third and fourth impurity layers 111 and 112 by ion implantation or a diffusion of phosphorus (P) or arsenic (As).

A silicon oxide layer 115 for a layer insulation is formed upon an entire surface of the substrate 101 by a chemical vapor deposition (CVD), and contact holes 116 are formed by a photo-etching method in such a manner that the holes 116 pass through the gate oxide layer 104 and the silicon oxide layer 115, respectively, from the first and fourth impurity diffusion layer 108 and 114, which will be source regions of a PMOS and an NMOS, to the upper surface of the oxide layer 115. In the holes 116, metal wiring portions 117 are formed of an alloy of aluminum (Al) and silicon (Si) by means of a sputtering method and a patterning using a photo-etching method.

A passivation layer 118 is formed on the entire surface of a wiring layer consisting of the oxide layer 115 and the wiring portions 117.

However, the conventional MOSFET is in a dilemma between an improvement of reliability and an improvement of a device characteristic, namely, between a suppression of short-channel effects and an improvement of a current-driving capability, and this problem is especially serious, particularly with pMOSFETs. Here, short-channel effects mean that, in a short-channel MOSFET, since a depletion layer extending under the gate contributes as a depletion layer on the side of the drain electrode, the depletion layer to be used by the gate electrode decreases, thereby reducing the threshold voltage. Accordingly, if a MOSFET has a short-channel structure, the threshold voltage decreases because the threshold voltage sensitively depends upon the length of the channel under the gate.

With respect to short-channel effects, there is also a problem as described below. Because the mass of boron (B) is smaller than that of phosphorus (P) or arsenic (As), as the material of the impurity diffusion layer of a PMOS, boron (B) is inserted deeper into the substrate under ion implantation. Moreover, since the diffusion coefficient of boron (B) is larger than that of arsenic (As), it is difficult to form the shallow p$^+$-junction used in a pMOSFET, thereby resulting in the problem that the depth of the junction causes the short-channel effects to be more serious.

With respect to mitigation of short-channel effects, a channel type may be changed into a surface channel type, or an LDD (a lightly doped drain source) structure. However, since both configurations make the device characteristics deteriorate, these are not the best countermeasures.

When the gate electrode is formed of materials having a predetermined work function, it is possible to make a MOSFET having both a surface channel type and a buried channel type. Namely, when n$^+$-type polysilicon is used as the gate electrode, the nMOSFET becomes a surface channel type and the pMOSFET becomes a buried channel type. In the buried channel type, a carrier is flowing in a portion which is different from the gate oxide layer and a boundary plane of the substrate within a short distance of the gate oxide layer, thereby making the short-channel effects more remarkable. Accordingly, a p$^+$-type polysilicon is used as a pMOSFET to make it into a surface channel type, thereby mitigating the short-channel effects. As shown in FIG. 2, the surface channel type has a threshold voltage larger than that of the buried channel type at the same length of the gate electrode. Accordingly, if the threshold voltage needs to be kept to a predetermined level, it is possible to make the gate electrode length of the surface channel type MOS shorter than that of the buried channel type MOS.

However, in the surface channel type, since the carrier flows over the boundary surface of the MOS, resistive operation by the gate oxide layer interrupts the flowing of the carrier, thereby reducing a current-driving capability in comparison with the buried channel type, as shown in FIG. 3. As a result, even though the surface channel type has an effect in that the channel length can be shortened, the current-driving capability of the surface channel type is reduced. Accordingly, it is impossible to improve operation speed.

On the other hand, the LDD structure as shown in FIG. 4 can also reduce short-channel effects.

In FIG. 4, the LDD MOS comprises an n-type substrate 401, a gate oxide layer 402, an n$^+$-type polysilicon layer 403 to be the gate electrode, a first impurity layer 404 for preventing punch-through, a second impurity layer 405 for adjusting the threshold voltage $V_{th}$, a first p⁺-type impurity diffusion layer 406 which will be a source region, and a second p⁺-type impurity diffusion layer 407 which will be a drain region. In the LDD structure, the difference from the constitution shown in FIG. 1 resides in that third and fourth impurity regions 408 and 409 are provided at all the inner sides of the first and second impurity regions 406 and 407 and have a low impurity concentration of 1E18 to 1E19 atoms/cm³ (in this example, p⁻-type).

Since the LDD structure can form a shallow junction by the p⁻-type impurity diffusion layers 408 and 409, it is possible to suppress short-channel effects.

However, since the low concentration layers such as the impurity diffusion layers 408 and 409 have a large resistance, the current-driving capability is reduced, thereby resulting in the formation of a MOS which is not adaptive to high-speed operation.

Even though the problems of the conventional MOSFET have been described mainly with respect to a PMOS, an NMOS is also in a dilemma between an improvement of the current-driving capability and a reduction of short-channel effects in surface and buried channel types and in an LDD structure.

As described above, the conventional MOSFET is in a dilemma between a suppression of short-channel effects and an improvement of a current-driving capability.

SUMMARY OF THE INVENTION

In view of the above-mentioned condition, an object of the present invention is to provide MOS devices having an electrode structure capable of coping with short-channel effects and a manufacturing method thereof, without sacrificing current-driving capabilities.

More specifically, an object of the present invention is to provide a semiconductor device capable of realizing a MOSFET structure adopting a buried channel type and suppressing short-channel effects.

In order to achieve the above-mentioned objects, a MOS device according to the present invention comprises a semiconductor substrate having a first conductivity type, an element-dividing insulation layer which is formed in the manner of dividing the substrate into element regions and insulation regions between the element regions, a gate insulation layer formed on the element regions, a source region impurity diffusion layer formed on one side of a channel formation layer in the element regions and having a second conductivity type, a drain region impurity diffusion layer formed on the other side of the channel formation layer in the element region and having the second conductivity type, and a gate electrode semiconductor layer formed on the channel formation layer through the gate insulation layer in such a manner that, in a portion contacting the gate insulation layer, the closer the portion approaches the impurity layers of the source and drain regions, the more the work function increases.

In a desired embodiment, a gate electrode semiconductor layer is formed in such a manner that the maximum value of the work function increases 0.5 eV (electron volts) or more than the minimum value in a portion contacting the gate insulation layer.

Such an embodiment can be realized by an n⁺-type polysilicon layer which is formed on an intermediate region of the channel formation layer, and a p⁺-type polysilicon layer which is formed as a side wall of the n⁺-type polysilicon layer.

The semiconductor device according to the present invention is made by the following method. The manufacturing method comprises a step of forming an element-dividing insulation layer in the manner of dividing the substrate into element regions and insulation regions between the element regions, a step of forming a gate insulation layer on the element regions, a step of forming a first semiconductor layer on a channel formation layer through the gate insulation layer, a step of patterning the first semiconductor layer as a gate electrode, and a step of forming a second semiconductor layer on both side walls of the first semiconductor layer having a work function larger than that of the first semiconductor layer.

According to the present invention, since the semiconductor layer forming the gate electrode is formed in such a manner that the work function of the portion contacting the gate insulation layer becomes larger and larger upon approaching the impurity diffusion layer of the source region and drain region, a voltage which is supplied to the channel formation layer fron portion having a relatively high work function in the semiconductor layer is usually lower than a voltage which is supplied from a portion having a relatively low work function. Since the formation of the channel in the intermediate portion of the channel formation layer is performed by the gate electrode portion having a relatively low work function and since the formation of the channel in the edge portion adjacent to each region of the source and drain is performed by the gate electrode portion having a relatively high work function, many more carriers are usually excited in the edge portion of the channel formation layer in comparison with the intermediate channel portion, thereby obtaining ajunction which is shallowly and effectively formed at the edges of the source and drain which has a resistance lower than that of the channel intermediate portion. Accordingly, the semiconductor devices are comprised of the channel intermediate portion having a high current-driving capability, the channel edge portions capable of overcoming short-channel effects, and the surface type channel having a high current-driving capability with low resistance, thereby obtaining a MOSFET having an effective structure for overcoming short-channel effects, especially a pMOSFET.

DETAILED DESCRIPTION OF THE PREFERRED EMBODIMENTS

There will be described in detail semiconductor devices according to preferred embodiments of the present invention in reference with the attached drawings.

Figure 1:
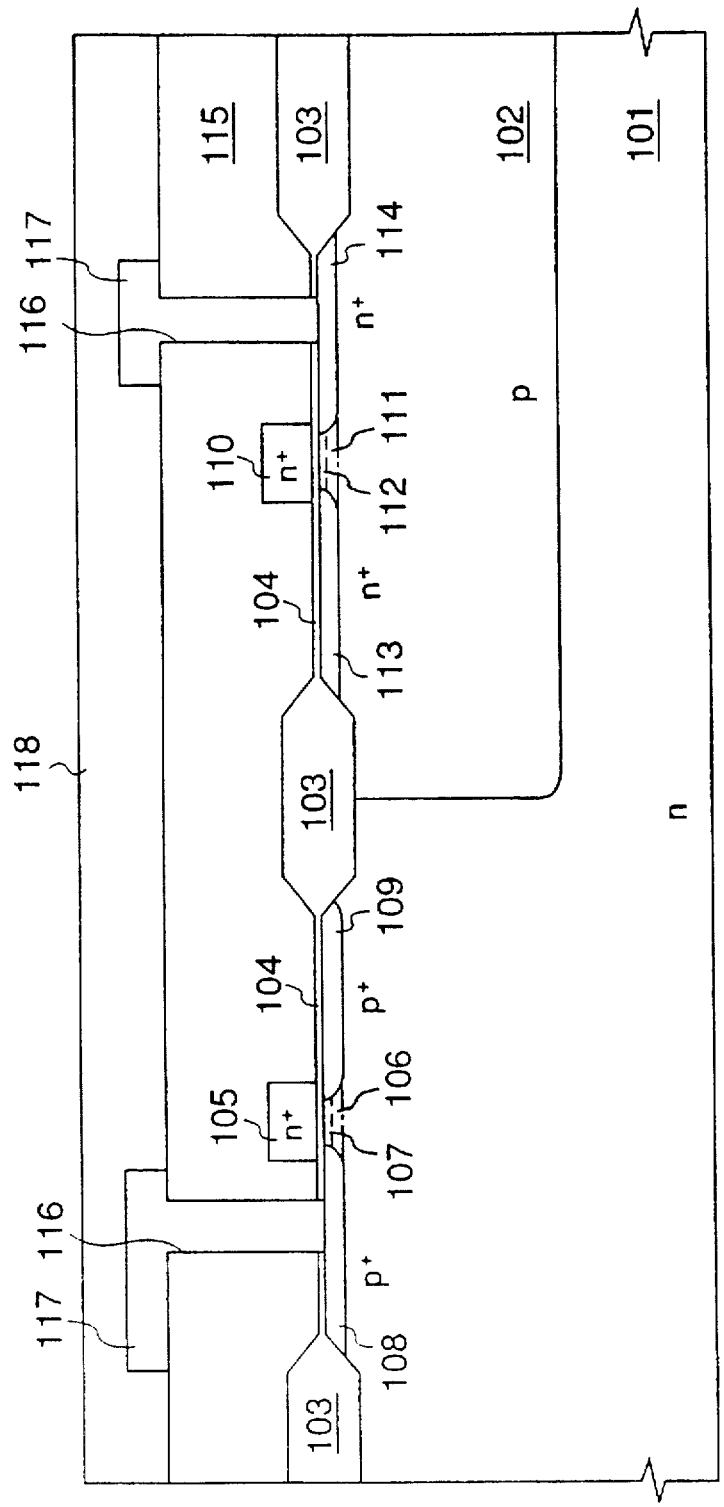
FIG. 1 is a sectional view of an element showing a constitution of a conventional CMOS inverter.
Figure 2:
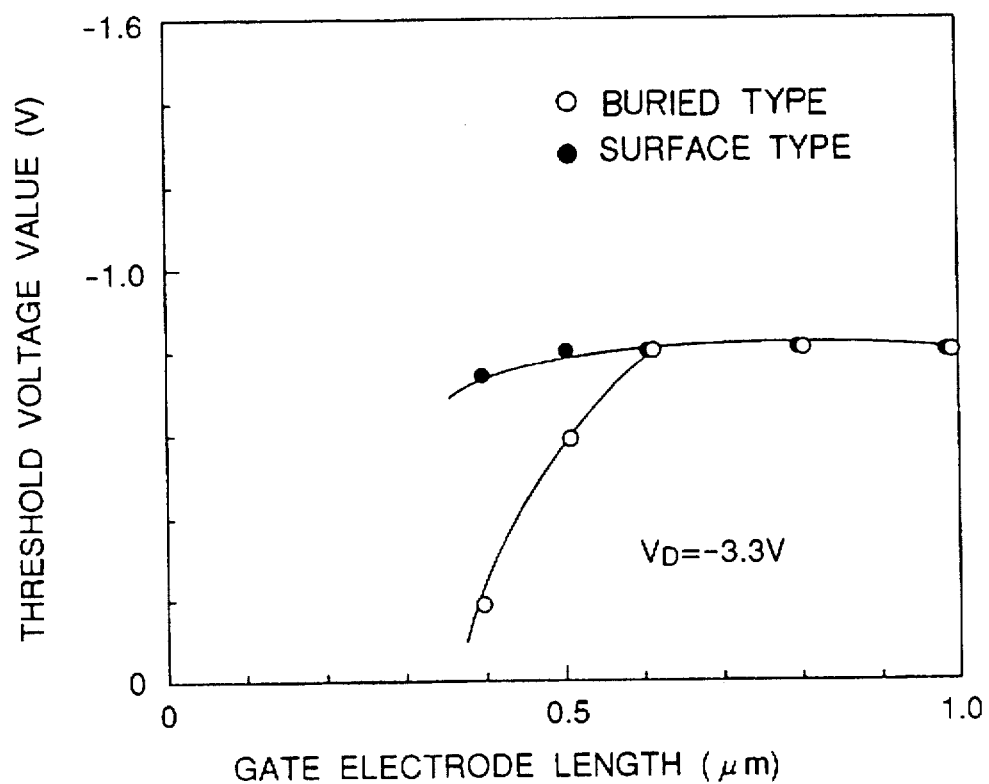
FIG. 2 is a graph showing a difference of short-channel effects according to a channel type between a surface type and a buried type.
Figure 3:
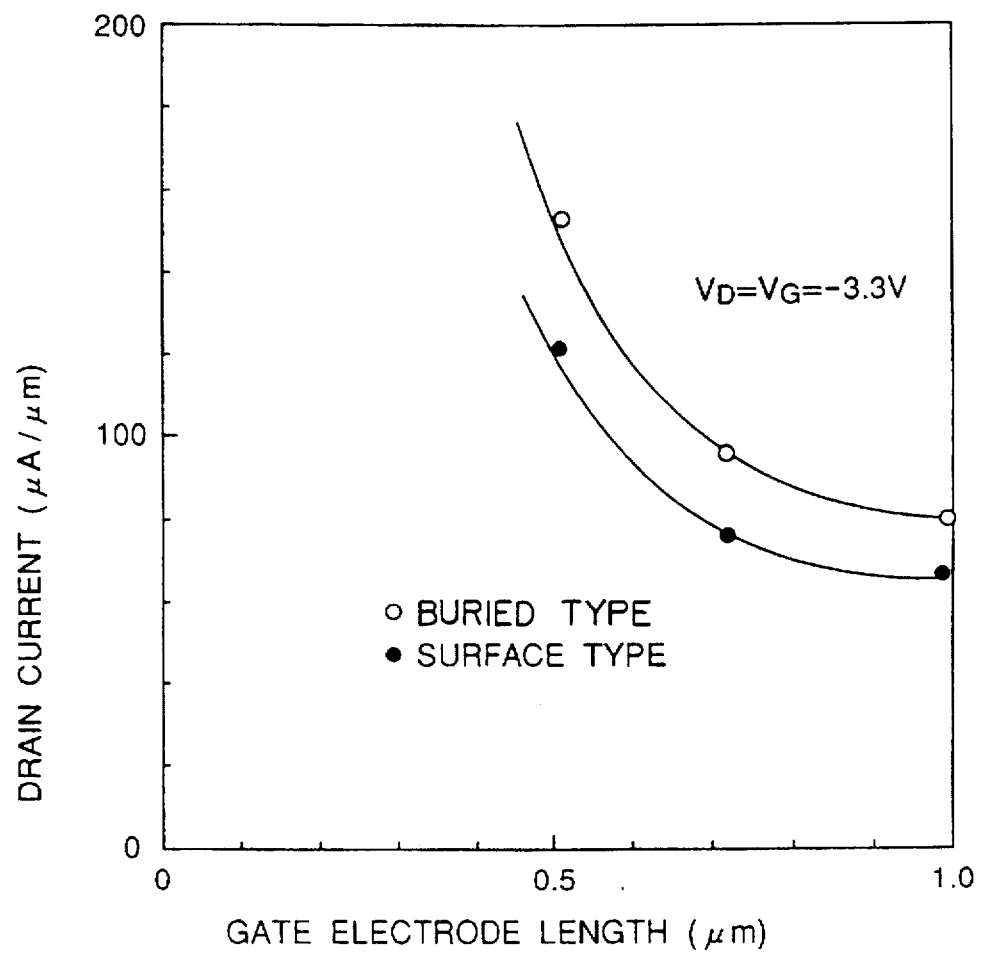
FIG. 3 is a graph showing a difference of a current-driving capability according to a channel type between a surface type and a buried type.
Figure 4:
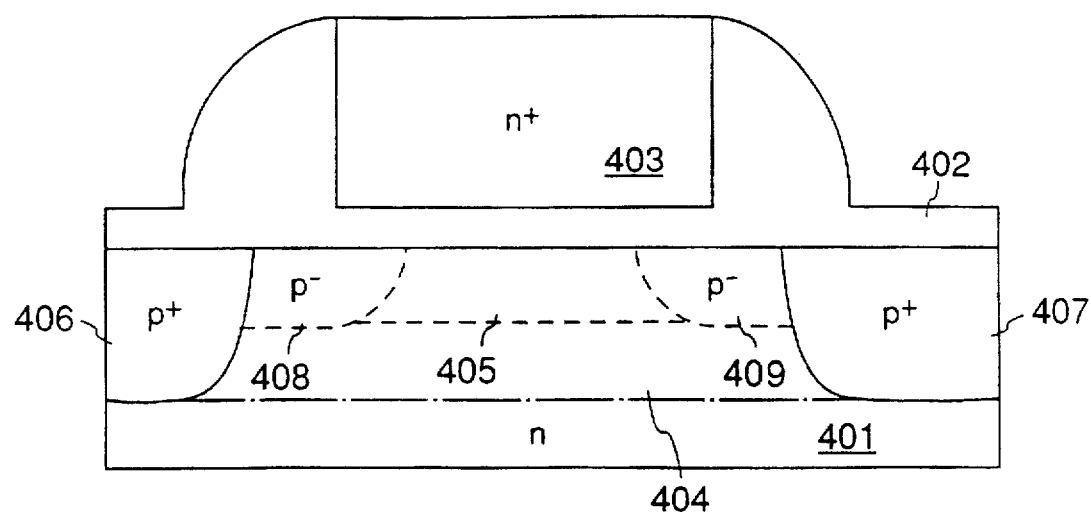
FIG. 4 is a sectional view of an element showing a main constitution of a conventional LDD pMOSFET.
Figure 5:
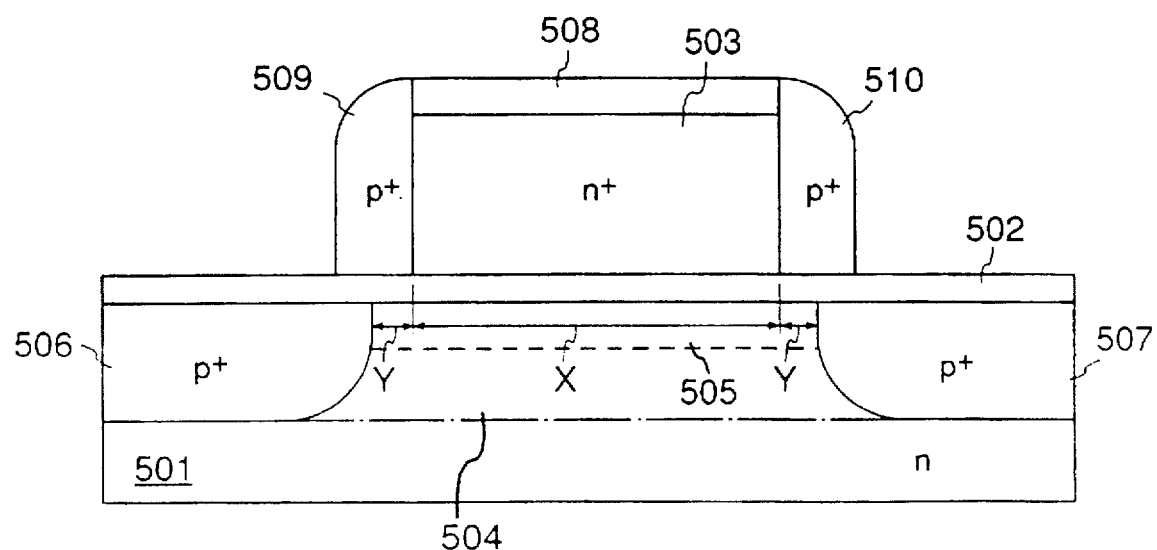
FIG. 5 is a sectional view of an element showing a main constitution of a pMOSFET device according to a first embodiment of the present invention.

FIG. 5 shows a main constitution of a pMOSFET as a semiconductor device according to a first embodiment of the present invention.

In FIG. 5, numeral 501 denotes a silicon, Si (100), substrate having an n-type conductivity type and a comparative resistivity of 1-2 Ω cm (ohm-cm), a gate oxide layer 502 is formed on the substrate 501, and a polysilicon layer 503 is formed on the gate oxide layer 502, which constitutes a portion of a gate electrode and is an $n^+$-type to which phosphorus is added in a high concentration.

A first impurity addition layer 504, for preventing punch-through, is formed in a region near a surface immediately under the polysilicon layer 503 in the substrate by means of implantation of ions of low-concentration phosphorus. A second impurity addition layer 505, for adjusting the threshold voltage $V_{th}$, is formed between the first impurity addition layer 504 and a surface of the substrate 501 by means of ion implantation with a phosphorus concentration higher than that of the first impurity addition layer 504, to a small degree.

A first $p^+$-type impurity diffusion layer 506 to be a source is formed on one side of the impurity addition layers 504 and 505 in the substrate 501 by means of ion implantation and diffusion of boron, and a second $p^+$-type impurity diffusion layer 507 is formed on the other side of the impurity addition layers 504 and 505 to be a drain.

The gate polysilicon layer 503 is positioned at an intermediate portion of a channel formation layer in the substrate 501, and a CVD oxide layer 508 covers the polysilicon layer 503 to a thickness of 1,000 angstroms. Polysilicon layers 509 and 510 to be side walls are formed on a side of the two-strata layer of the polysilicon layer 503 and the oxide layer 508, which constitutes the gate electrode, together with the polysilicon layer 503, and in which a high concentration of boron is implanted and diffused to form a $p^+$-type conductivity type, thereby resulting in a work function 1.1 eV higher than that of the polysilicon layer 503. The polysilicon layers 509 and 510 are respectively arranged in such a manner that the layer 509 is positioned on an edge of the impurity diffusion layer 506 and the impurity addition layers 504 and 505, and the layer 510 is positioned on an edge of the impurity diffusion layer 507 and the impurity addition layers 504 and 505.

In the above-mentioned constitution, since the work function of the polysilicon layers 509 and 510 is 1.1 eV higher than that of the polysilicon layer 503, a voltage supplied to a lower region of the polysilicon layers 509 and 510 (an area shown by symbol Y in FIG. 5) is usually 1.1 V lower than a voltage supplied to a lower region of the polysilicon layer 503 (an area shown by symbol X in FIG. 5). Since channel formation in an intermediate portion of a channel formation layer is performed by the polysilicon layer 503 which is positioned over the intermediate portion of the channel formation layer and since the polysilicon layers 509 and 510 are positioned on both edges of the respective channel region and control channel formation, the edge portions of the channel formation layer usually excite many carriers more than that of the intermediate portion. Accordingly, the semiconductor devices are comprised of the channel intermediate portion having a high current-driving capability, the channel edge portions capable of overcoming short-channel effects, and the surface type channel having a high current-driving capability with low resistance, thereby obtaining a MOSFET having an effective structure for overcoming short-channel effects, especially in a pMOSFET.

Figure 6:
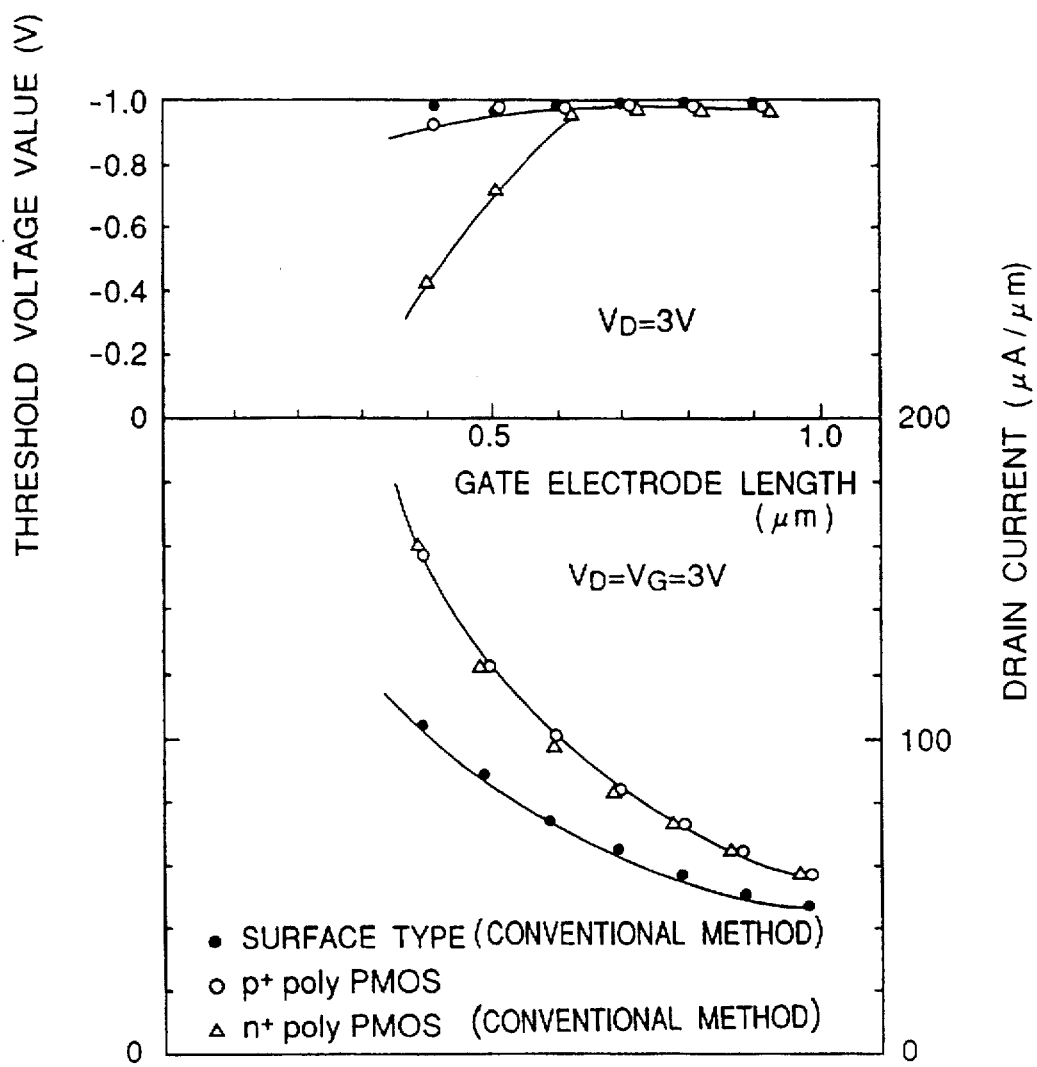
FIG. 6 is a graph showing measurement results of short-channel effects and a current-driving capability with respect to the pMOSFET shown in FIG. 5.

FIG. 6 shows a result of measuring short-channel effects and a current-driving capability by applying the first embodiment to a pMOSFET.

As shown in FIG. 6, the present invention can realize short-channel effects similar to the conventional surface channel type and a current-driving capability similar to the conventional buried channel type. Particularly, it is possible to recognize a 60% improvement of the current-driving capability by a channel having a length of 0.4 μm. Even though not shown in any figure, when we manufacture side walls of a MOSFET by using materials with work functions 0.5 eV different from the $n^+$-type polysilicon, there is an improvement of 10% in the current-driving capability. Even though there are few errors in such processes, a 10% improvement results in few effects. Accordingly, in order to increase the effectiveness of the present invention, it is necessary to make the difference between work functions between the polysilicon layer 503 and the layers 509 and 510 to at least be 0.5 eV or more.

Figure 7:
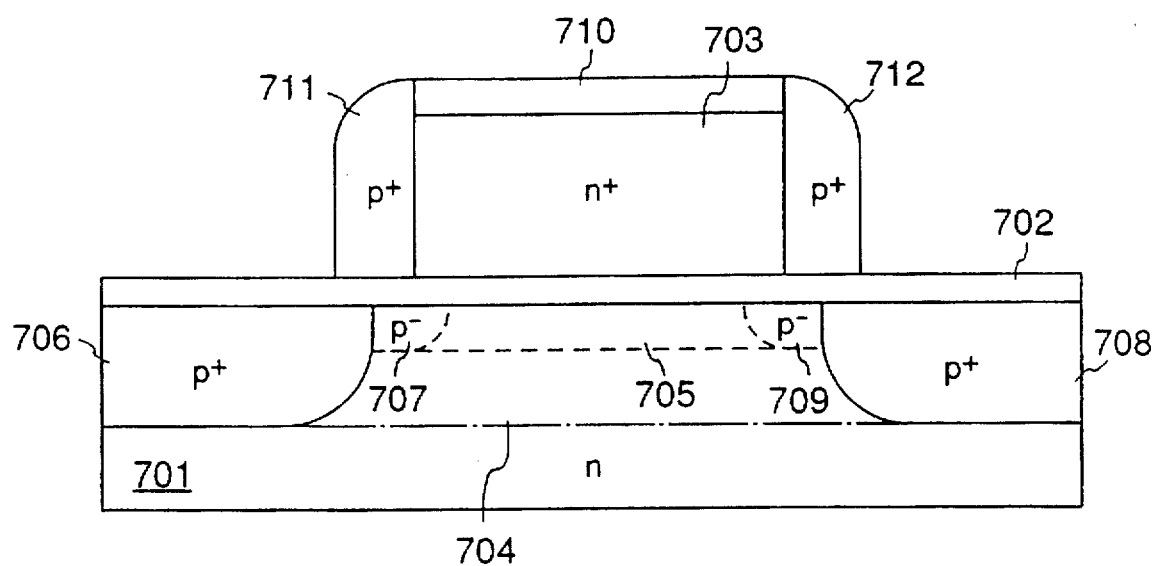
FIG. 7 is a sectional view of an element showing a main constitution of an LDD pMOSFET device according to a first embodiment of the present invention.

FIG. 7 shows a semiconductor device according to a second embodiment of the present invention, namely, a main constitution of a pMOSFET having an LDD structure.

In FIG. 7, numeral 701 denotes a silicon, Si (100), substrate having an n-type conductivity type and a comparative resistivity of 1-2 Ω-cm (ohm-cm), a gate oxide layer 702 is formed on the substrate 701, and a polysilicon layer 703 is formed on the gate oxide layer 702, which constitutes a portion of a gate electrode and is an $n^+$-type to which phosphorus is added in a high concentration.

A first impurity addition layer 704, for preventing punch-through, is formed in a region near a surface immediately under the polysilicon layer 703 in the substrate 701 by means of implantation of ions of low-concentration phosphorus (P). A second impurity addition layer 705, for adjusting the threshold voltage $V_{th}$, is formed between the first impurity addition layer 704 and a surface of the substrate 701 by means of ion implantation with a phosphorus (P) concentration higher than that of the first impurity addition layer 704, to a small degree.

A first $p^+$-type impurity diffusion layer 706 to be a source is formed on one side of the impurity addition layers 704 and 705 in the substrate 701 by means of ion implantation and diffusion of boron (B), and a first $p^-$-type impurity diffusion layer 707 to be a source region together with the layer 706 is formed between the impurity addition layer 705 and the $p^+$-type impurity diffusion layer 706 by means of ion implantation and diffusion of boron (B). A second $p^+$-type impurity diffusion layer 708 to be a drain is formed on the other side of the impurity addition layers 704 and 705 by means of ion implantation and diffusion of boron (B), and a second $p^-$-type impurity diffusion layer 709 to be a drain region together with the layer 708 is formed between the impurity addition layer 705 and the p⁺-type impurity diffusion layer 708 by means of ion implantation and diffusion of boron (B).

The gate polysilicon layer 703 is positioned at an intermediate portion of a channel formation layer in the substrate 701, and a CVD oxide layer 710 covers the polysilicon layer 703 to a thickness of 1,000 angstroms. Polysilicon layers 711 and 712 to be side walls are formed on a side of the two-strata layer of the polysilicon layer 703 and the oxide layer 710, which constitutes the gate electrode, together with the polysilicon layer 703, and in which a high concentration of boron is implanted and diffused to form a p⁺-type conductivity type, thereby resulting in a work function 1.1 eV higher than that of the polysilicon layer 703. The polysilicon layers 711 and 712 are respectively arranged in such a manner that the layer 711 is positioned on an edge of the impurity diffusion layers 706 and 707, and the layer 712 is positioned on an edge of the impurity diffusion layers 708 and 709.

By the above-mentioned constitution, it is possible to obtain an effect similar to that of the first embodiment shown in FIG. 5. Namely, since the work function of the polysilicon layers 711 and 712 is 1.1 eV higher than that of the polysilicon layer 703, a voltage supplied to a lower region of the polysilicon layers 711 and 712 is usually 1.1 V lower than a voltage supplied to a lower region of the polysilicon layer 703. Since channel formation in an intermediate portion of a channel formation layer is performed by the polysilicon layer 703 which is positioned over the intermediate portion of the channel formation layer and since the polysilicon layers 711 and 712 are positioned on both edges of the respective channel region and control channel formation, the edge portions of the channel formation layer usually exite many carriers more than that of the intermediate portion. Accordingly, the semiconductor devices are comprised of the channel intermediate portion having a high current-driving capability, the channel edge portions capable of overcoming short-channel effects, and the surface type channel having a high current-driving capability with low resistance, thereby obtaining a MOSFET having an effective structure for overcoming short-channel effects, especially in a pMOSFET.

Figure 8:
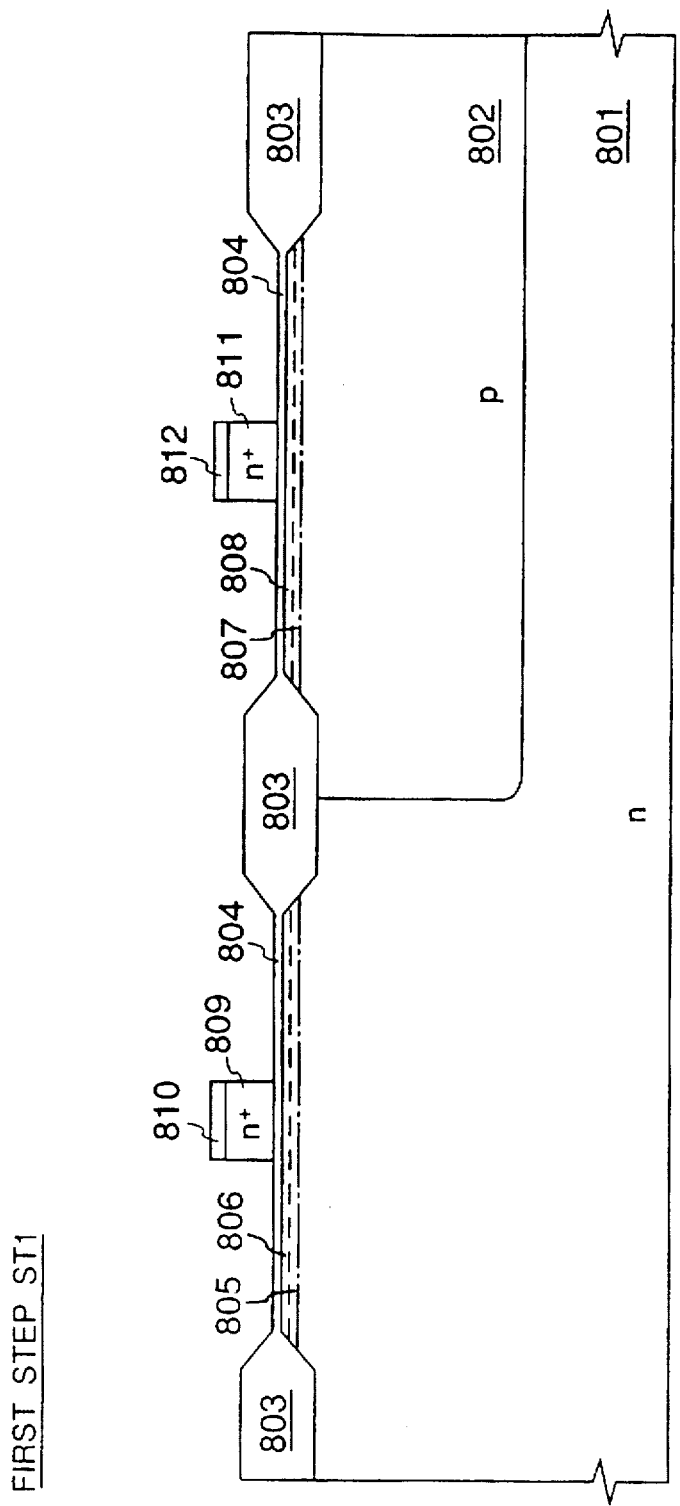
FIG. 8 is a sectional view of an element for explaining formation from a p-well to a polysilicon layer to be a first semiconductor layer in a manufacturing method thereof when a PMOS as shown in FIG. 5 is applied to a CMOS inverter.
Figure 9:
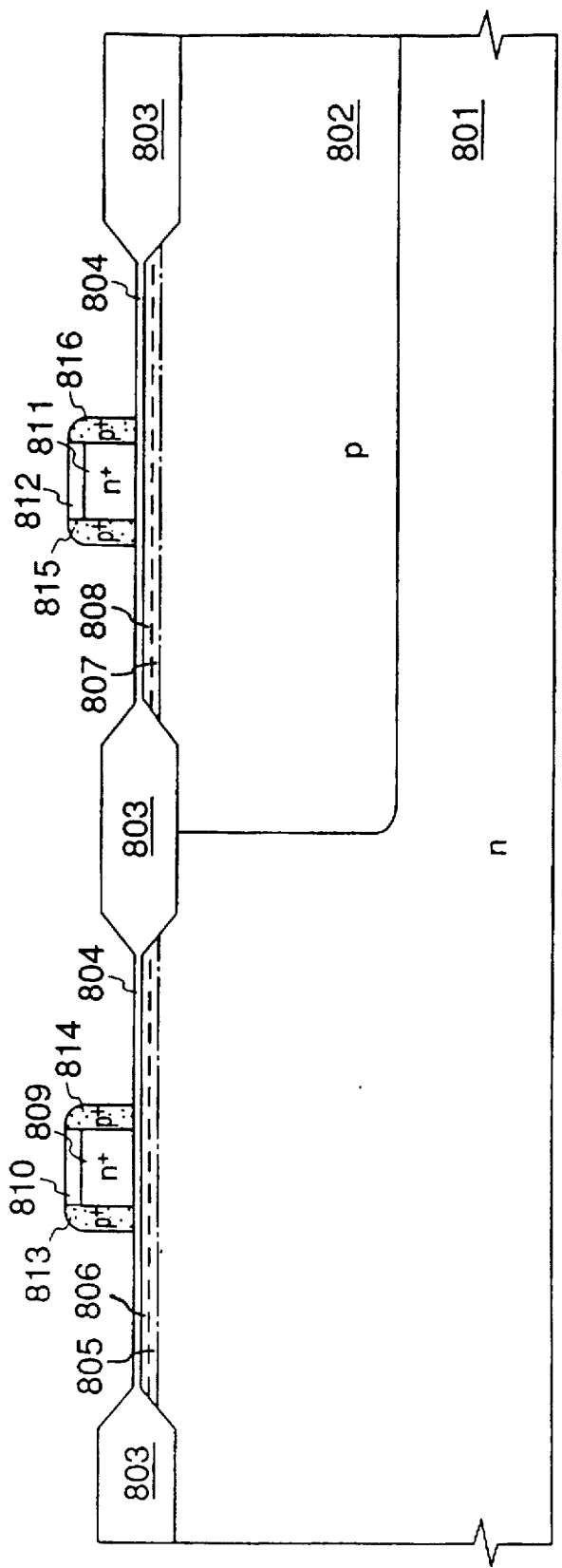
FIG. 9 is a sectional view of an element for explaining a step of forming a side wall to be a second semiconductor layer, succeeding the step shown in FIG. 8.
Figure 10:
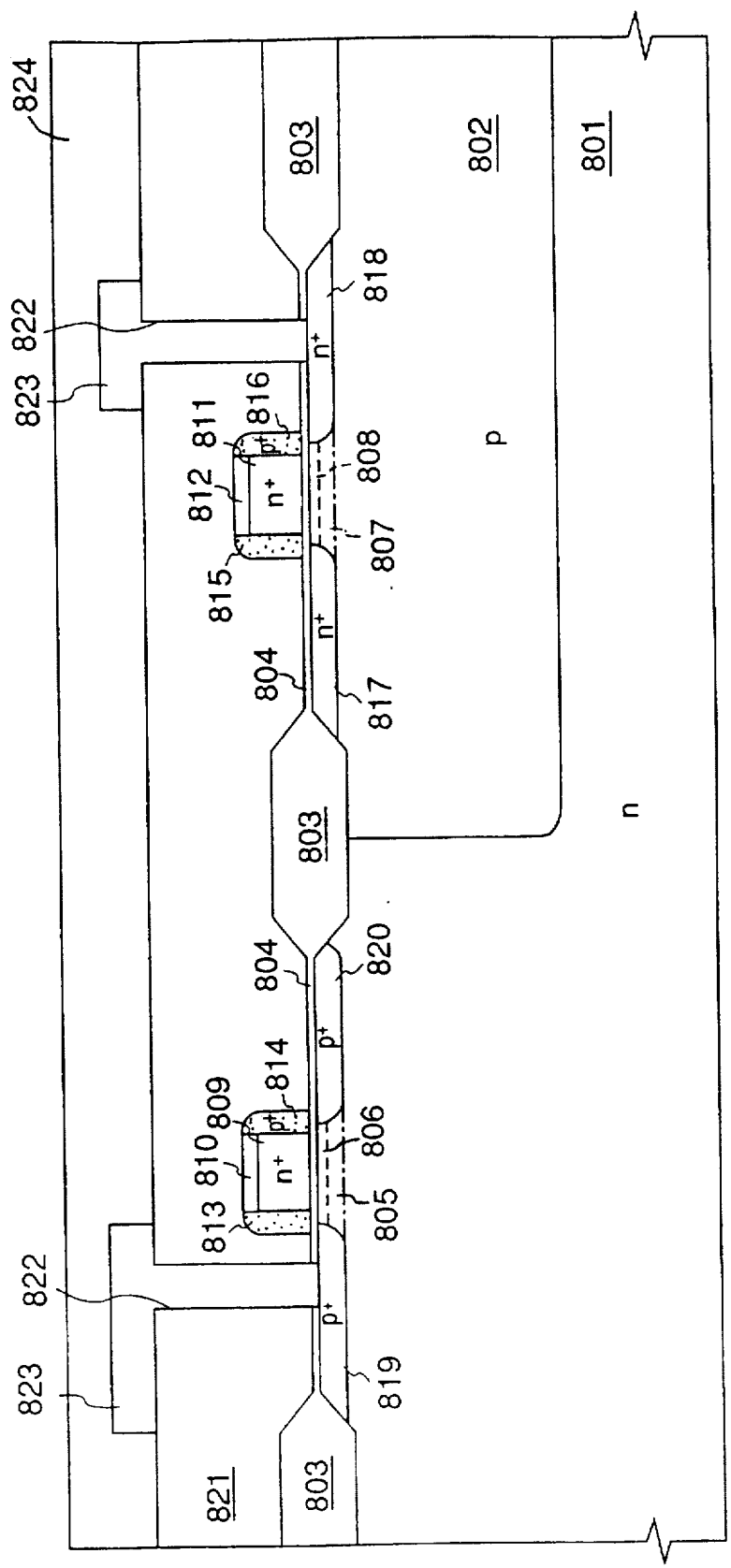
FIG. 10 is a sectional view of an element for explaining the steps of formation from source and drain regions to a passivation layer, succeeding the step shown in FIG. 9.

FIGS. 8-10 show a manufacturing process in the case where the constitution shown in FIG. 5 is applied to a CMOS inverter.

At first, as shown in FIG. 8, in a silicon (Si) substrate 801 having a crystal direction (100) of an n-type conductivity type and a comparative resistivity of 1–2 Ω cm, a p-type well 802 is formed with a depth of about 3 μm. After this, an oxide layer 803 is formed by a heat oxidation and selective oxidation so as to form an element region and an insulation-division region. Then, a gate oxide layer 804 is formed on the element region with a depth of 100 angstroms.

Then, ions of boron (B) are implanted into a region under the gate oxide layer 804, with masking over the well 802, with 100 keV of energy and 4E12 ions/cm² of dose amount so as to form an impurity addition layer 805 for preventing punch-through. Next, ions of boron (B) are implanted into a shallow portion of the same region with 25 keV of energy and 5E12 ions/cm² of dose amount so as to form an impurity addition layer 806 for adjusting the threshold voltage.

Next, ions of phosphorus (P) are implanted into the well 802, with the region outside of the well 802 being masked, with 220 keV of energy and 3E12 ions/cm² of dose amount so as to form an impurity addition layer 807 for preventing punch-through. Next, ions of phosphorus (P) are implanted into a shallow portion of the same region with 20 keV of energy and 3E12 ions/cm² of dose amount so as to form an impurity layer 808 for adjusting the threshold voltage.

Next, phosphorus (P) is diffused over the entire surface after depositing 3,000 angstroms of polysilicon on the surface so as to form the polysilicon layer to be an n⁺-type conductivity type. Furthermore, an oxide layer with a thickness of 1,000 angstroms is deposited on the polysilicon layer by a chemical vapor deposition (CVD). Then, the two-strata layer of the polysilicon layer and the oxide layer is treated by patterning by means of a lithographic technique and etching so as to form a gate electrode including a polysilicon layer 809 and an oxide layer 810, and a gate electrode including a polysilicon layer 811 and an oxide layer 812 (step ST1).

Next, p⁺-type polysilicon is deposited over the entire surface with a thickness of 1,000 angstroms to form a polysilicon layer which will be treated by reactive ion etching (RIE). As shown in FIG. 9, side walls 813 and 814 are formed on the two-strata layer including the polysilicon layer 809 and the oxide layer 810, and, at the same time, side walls 815 and 816 are formed on the two-strata layer including the polysilicon layer 811 and the oxide layer 812 (step ST2).

After that, as shown in FIG. 10, ions of arsenic (As) or phosphorus (P) are implanted into both sides of the gate electrode in the well 802 so as to form n⁺-type impurity diffusion layers 817 and 818 to be source and drain regions of the nMOSFET. Then, ions of boron (B) or boron fluoride (BF₂) are implanted into both sides of the gate electrode in the substrate 801 so as to form p⁺-type impurity diffusion layers 819 and 820 to be source and drain regions of the pMOSFET.

Next, an oxide layer is deposited over the entire surface by a chemical vapor deposition (CVD) to form a layer-dividing oxide layer 821 for dividing the element layer and the wiring layer. After that, a contact hole 822 is formed by a photographic etching method, and a wiring portion 823 is formed by a photographic etching method after sputtering aluminum-silicon (Al-Si) by a sputtering method. Lastly, a passivation layer 824 is formed, completing a wiring step (step ST3).

According to the above-mentioned steps, it is possible to obtain a CMOSFET having two kinds of work functions of the gate electrode which contacts at least a MOS boundary surface of a MOSFET, and a CMOS which can change carrier densities excited into the contact region between the source and drain and in the channel intermediate region.

Even though the method of generating p⁺-type polysilicon at the side walls of the n⁺-type polysilicon of the pMOSFET has been described in the first embodiment, it is possible to obtain the same effect as above by the following method. Namely, an n⁺-type polysilicon gate electrode is formed by the ordinary method, and after that, side walls of p⁺-type polysilicon are formed by an ion implantation and diffusion method.

Furthermore, since the p⁺-type polysilicon side walls are formed on the side of an nMOSFET in the constitution shown in FIGS. 8-10, such a case has the effect of improving reliability by mitigating an electric field near the drain because the drain current flows in the silicon layer.

Even though there have been described cases using polysilicon in the above embodiment of the present invention, when silicide or metal may be used in the place of p⁺-type polysilicon, it is possible to obtain the same effects as described above.

What is claimed is:

1. A method of manufacturing a semiconductor device, the method comprising the steps of:

forming an element dividing insulation layer to divide a substrate having a first conductivity type into element regions and insulation regions between the element regions;

forming a gate insulation layer on the element regions;

forming a first semiconductor layer of the first conductivity type on the gate insulation layer above a channel formation layer, the first semiconductor layer having a first work function;

forming an insulation layer on the first semiconductor layer;

patterning the first semiconductor layer and the insulation layer;

forming a second semiconductor layer of a second conductivity type opposite to the first conductivity type on side walls of the patterned first semiconductor layer and the patterned insulation layer, using the patterned insulation layer to protect the patterned first semiconductor layer, the second semiconductor layer having a second work function larger than said first work function of the first semiconductor layer;

forming a gate electrode including the patterned first layer, the patterned insulation layer and the second semiconductor layer; and forming source and drain regions by diffusing a high concentration semiconductor impurity having a second conductivity type different from said first conductivity type so that said second semiconductor layer partially overlaps at least one of said source and drain regions.

2. A method of manufacturing a semiconductor device, the method comprising the steps of:

forming a gate oxide layer on a silicon substrate of n-type conductivity type;

forming a first polysilicon layer, of n$^+$-type conductivity type to which a high concentration of phosphorus is added, at an intermediate position of a channel formation region of the silicon substrate on the gate oxide layer to form a first portion of a gate electrode, the first polysilicon layer having a first work function;

forming an oxide layer by chemical vapor deposition (CVD) as an insulation layer on an upper surface of the first polysilicon layer to form a second portion of said gate electrode;

forming a second polysilicon layer, of p$^+$-type conductivity type to which a high concentration of boron is added on side walls of the first polysilicon layer and the oxide layer to form a third portion of said gate electrode, the second polysilicon layer having a second work function larger than said first work function of the first polysilicon layer; and forming on both sides of the channel formation layer of the silicon substrate a p$^+$-type conductivity type impurity diffusion layer to which a high concentration of boron is added, to form source and drain regions so that said second polysilicon layer partially overlaps at least one of said source and drain regions.

3. The method of claim 2, including the steps of:

forming a first impurity addition layer by implanting a low concentration of phosphorus ions, said first impurity addition layer formed near an upper surface of the silicon substrate under the first polysilicon layer; and forming a second impurity addition layer for adjusting a threshold value by implanting a concentration of phosphorus ions higher than said low concentration of the first impurity addition layer, said second impurity addition layer formed between the first impurity addition layer and the upper surface of the silicon substrate.

4. A method of manufacturing a semiconductor device, the method comprising the steps of:

forming a gate oxide layer on a silicon substrate of n-type conductivity type;

forming a first polysilicon layer, of n$^+$-type conductivity type to which a high concentration of phosphorus is added, at an intermediate position of a channel formation region of the silicon substrate on the gate oxide layer to form a first portion of a gate electrode, the first polysilicon layer having a first work function;

forming an oxide layer by chemical vapor deposition (CVD) as an insulation layer on an upper surface of the first polysilicon layer to form a second portion of said gate electrode;

forming a second polysilicon layer, of p$^+$-type conductivity type to which a high concentration of boron is added on side walls of the first polysilicon layer and the oxide layer to form a third portion of said gate electrode, the second polysilicon layer having a second work function larger than said first work finction of the first polysilicon layer; and forming on both sides of the channel formation layer of the silicon substrate a p$^-$-type conductivity type impurity diffusion layer to which a low concentration of boron is added, and forming, on both outer sides of the p$^-$-type conductivity type impurity diffusion layers, a p$^-$-type conductivity type impurity diffusion layer to which a high concentration of boron is added, to form a source region using a first pair of said p$^+$-type and p$^-$-type impurity diffusion layers and a drain region using a second pair of said p$^+$-type and p$^-$-type impurity diffusion layers so that said second polysilicon layer partially overlaps at least one of said p$^+$-type impurity diffusion layers of said source and drain regions.

5. The method of claim 4, including the steps of:

forming a first impurity addition layer by implanting a low concentration of phosphorus ions, said first impurity addition layer formed near an upper surface of the silicon substrate under the first polysilicon layer; and forming a second impurity addition layer for adjusting a threshold value by implanting a concentration of phosphorus ions higher than said low concentration of the first impurity addition layer, said second impurity addition layer formed between the first impurity addition layer and the upper surface of the silicon substrate.

* * * * *